(12) United States Patent
Prisco et al.

(10) Patent No.: US 11,747,373 B2
(45) Date of Patent: Sep. 5, 2023

(54) DETECTING ELECTRICAL POWER LINE DISTURBANCES

(71) Applicant: International Business Machines Corporation, Armonk, NY (US)

(72) Inventors: Joseph F. Prisco, Rochester, MN (US); Eric B. Swenson, Pine Island, MN (US); Dennis J. Wurth, Rochester, MN (US); Andrew James Frana, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 17/112,518

(22) Filed: Dec. 4, 2020

(65) Prior Publication Data

US 2022/0178975 A1 Jun. 9, 2022

(51) Int. Cl.
*G01R 19/165* (2006.01)
*G01R 31/58* (2020.01)

(52) U.S. Cl.
CPC ......... *G01R 19/1659* (2013.01); *G01R 31/58* (2020.01)

(58) Field of Classification Search
CPC .............. G01R 31/40–74; G01R 19/1659
See application file for complete search history.

(56) References Cited

U.S. PATENT DOCUMENTS

| | | |
|---|---|---|
| 4,156,280 A | 5/1979 | Griess |
| 4,245,150 A | 1/1981 | Driscoll et al. |
| 5,216,621 A | 6/1993 | Dickens |
| 5,890,097 A | 3/1999 | Cox |
| 6,459,997 B1 | 10/2002 | Andersen |
| 6,542,023 B1 | 4/2003 | Daun-Lindberg et al. |
| 7,034,569 B1 | 4/2006 | Balasubramanian et al. |
| 8,160,824 B2 | 4/2012 | Spanier et al. |
| 8,779,931 B2 | 7/2014 | Yaney et al. |
| 9,047,076 B1 | 6/2015 | Lee |
| 9,444,280 B2 | 9/2016 | Lee |
| 10,367,414 B2 | 7/2019 | van Roosmalen et al. |

(Continued)

FOREIGN PATENT DOCUMENTS

JP 2000184603 A 6/2000

OTHER PUBLICATIONS

Disclosed Anonymously, "Design for testability: A method to integrate/simulate EPOW in system functional/stress test in order to determine system behavior due to Power Line Distributance for Early Fail Detection and Test," IP.com No. IPCOM000216950D, IP.com Electronic Publication Date: Apr. 25, 2012, 3 pages.

(Continued)

*Primary Examiner* — Feba Pothen
(74) *Attorney, Agent, or Firm* — Patterson + Sheridan, LLP (57) ABSTRACT

An apparatus includes a memory and a hardware processor communicatively coupled to the memory. The hardware processor receives, from a plurality of power supplies, a plurality of indications of electrical power disturbances detected by the plurality of power supplies and determines locations of the plurality of power supplies based on the plurality of indications. The hardware processor also determines, based on the plurality of locations, an event that caused the electrical power disturbances and classifies the event based on the location of the plurality of power supplies.

6 Claims, 5 Drawing Sheets

(56) References Cited

U.S. PATENT DOCUMENTS

| | | | |
|---|---|---|---|
| 10,422,833 B2 | 9/2019 | Saarinen et al. | |
| 2006/0168191 A1* | 7/2006 | Ives | G06F 11/3664 |
| | | | 709/224 |
| 2014/0268458 A1 | 9/2014 | Luciani et al. | |
| 2016/0321146 A1* | 11/2016 | Makino | G06F 11/1441 |
| 2017/0212799 A1* | 7/2017 | Konireddygari | G06F 11/0784 |
| 2017/0317908 A1* | 11/2017 | Jose | H04L 43/10 |
| 2019/0004911 A1* | 1/2019 | Das | G06F 11/2094 |
| 2021/0037035 A1* | 2/2021 | Graul | H04L 63/1425 |

OTHER PUBLICATIONS

Powertronics," PQR D50 Power Line Monitor," accessed online Oct. 21, 2020 [https://powertronics.com/products].

Disclosed Anonymously, "EPOW Solution for Power Line Distrubances," IP.com No. IPCOM000211173D, IP.com Electronic Publication Date: Sep. 26, 2011, 2 pages.

Subhamita Roy and Sudipta Nath, "Classification of Power Quality Distrubances using Features of Signals," International Journal of Schientific and Research Publications, vol. 2, Issue 11, Nov. 2012, 9 pages.

Ceati, "Powe Quality Energy Efficiency Reference Guide," 2007, CEA Technoloiges Inc. 114 Pages.

T.K. Hareendran, "Mains Voltage Sensor," Electroschematics.com, uploaded May 2015, 11 pages.

"Shop for Sensing, Monitoring and Control Solutions with Technical Expertise," Omega Engineering, Date Accessed: Oct. 25, 2022, pp. 1-6, https://www.omega.com/en-us/.

* cited by examiner

DETECTING ELECTRICAL POWER LINE DISTURBANCES

BACKGROUND

The present invention relates to electrical power disturbances, and more specifically, to diagnosing the cause of electrical power disturbances.

SUMMARY

According to another embodiment, an apparatus includes a memory and a hardware processor communicatively coupled to the memory. The hardware processor receives, from a plurality of power supplies, a plurality of indications of electrical power disturbances detected by the plurality of power supplies and determines locations of the plurality of power supplies based on the plurality of indications. The hardware processor also determines, based on the plurality of locations, an event that caused the electrical power disturbances and classifies the event based on the location of the plurality of power supplies.

According to one embodiment, a computing device includes a power supply. The power supply supplies power to the computing device. The power supply includes a hardware processor and a bus. The hardware processor detects an electrical power disturbance in the power supply. The bus communicates an indication of the electrical power disturbance to a monitoring device. Certain embodiments include a method performed by the computing device.

DETAILED DESCRIPTION

This disclosure describes an electrical power disturbance monitoring system that detects and diagnoses electrical power disturbances among a group of devices (e.g., servers in a datacenter), in particular embodiments. Generally, each device in the group includes a power supply that provides electric power to the device while monitoring the voltage signals entering and exiting the power supply to detect electrical power disturbances. The power supplies report detected electrical power disturbances to a monitoring device. The monitoring device tracks the physical locations of the detected electrical power disturbances to determine a cause. For example, the monitoring device may determine that the electrical power disturbances are caused by an event that is either a utility event (e.g., a power disturbance caused by a fault or disruption in electrical utilities) or a hardware event (e.g., a power disturbance caused by degraded or failing hardware in the devices). The monitoring device may then take appropriate remedial action based on that diagnosis.

Figure 1:
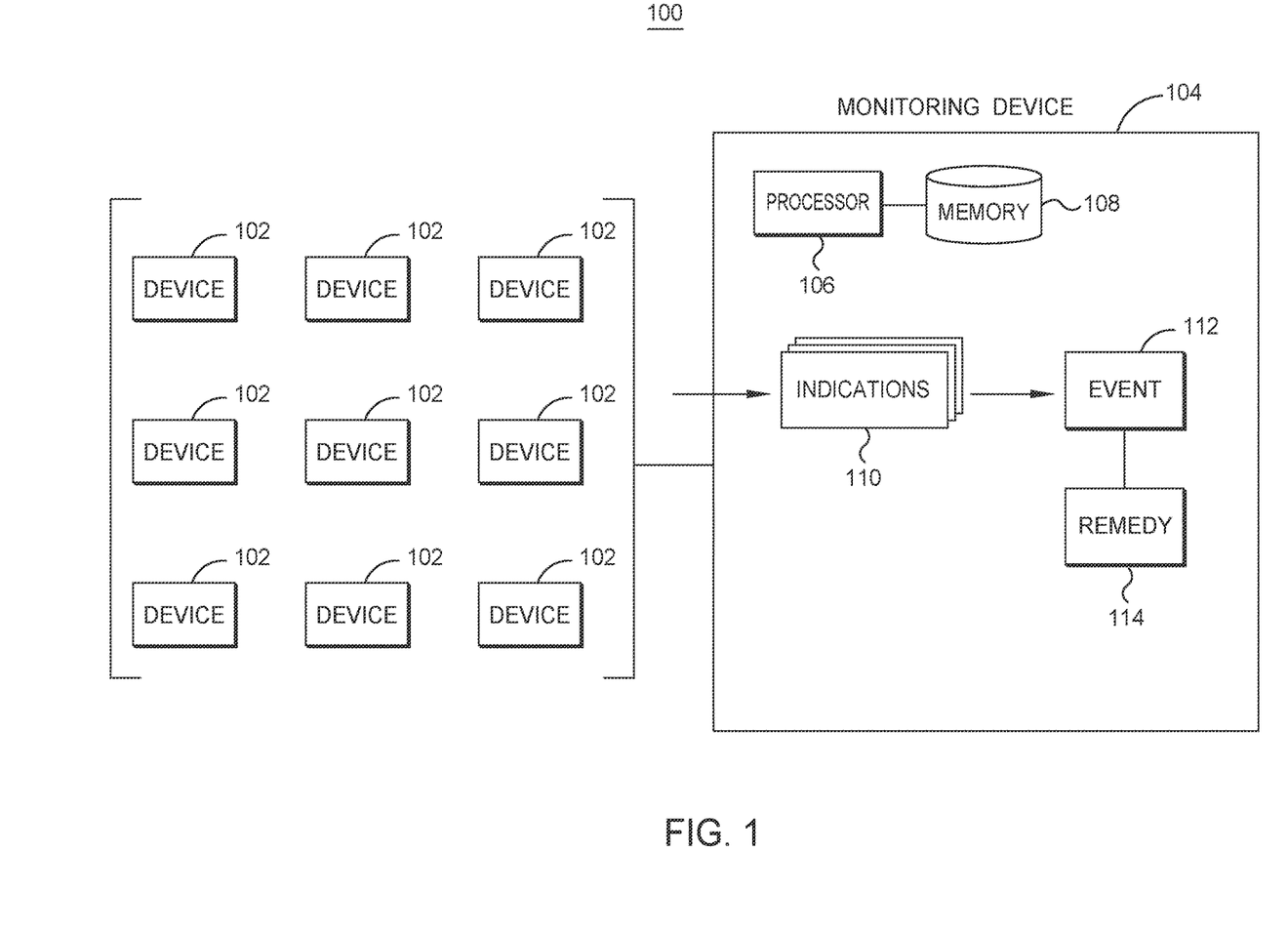
FIG. 1 illustrates an example system.

With reference now to FIG. 1, which shows an example system 100. As seen in FIG. 1, the system 100 includes a group of devices 102 and a monitoring device 104. Generally, each device 102 includes a power supply (not shown) that monitors for electrical power disturbances at the device 102. The power supplies communicate indications of detected electrical power disturbances to the monitoring device 104. The monitoring device 104 analyzes these indications to diagnose a cause of the electrical power disturbances and to determine a suitable remedy. In this manner, electrical power disturbances may be detected and diagnosed even if the electrical power disturbances are intermittent or difficult to reproduce, in particular embodiments.

The devices 102 may be any suitable computing device 102. For example, each device 102 may be a server in a datacenter or a computing device in an office. Each device 102 includes a power supply that supplies electric power to the device 102. Each power supply includes hardware and software that operate to detect electrical power disturbances in the power supply. When an electrical power disturbance is detected, the power supply may communicate an indication of the electrical power disturbance to the monitoring device 104. Additional details about the device 102 and the power supply will be provided with respect to FIGS. 2 and 4.

The device 102 includes any suitable device for communicating with components of the system 100 (e.g., the monitoring device 104). As an example and not by way of limitation, the device 102 may be a computer, a laptop, a wireless or cellular telephone, an electronic notebook, a personal digital assistant, a tablet, or any other device capable of receiving, processing, storing, or communicating information with other components of the system 100. The device 102 may also include a user interface, such as a display, a microphone, keypad, or other appropriate terminal equipment usable by the user 102. The device 102 may include a hardware processor, memory, or circuitry configured to perform any of the functions or actions of the device 102 described herein. For example, a software application designed using software code may be stored in the memory and executed by the processor to perform the functions of the device 102.

The monitoring device 104 diagnoses and determines suitable remedies for detected electrical power disturbances. As seen in FIG. 1, the monitoring device 104 includes a processor 106 and a memory 108, which are configured to perform any of the functions or actions of the monitoring device 104 described herein. In particular embodiments, the monitoring device 104 can diagnose and remedy electrical power disturbances that are intermittent or difficult to reproduce.

The processor 106 is any electronic circuitry, including, but not limited to microprocessors, application specific integrated circuits (ASIC), application specific instruction set processor (ASIP), and/or state machines, that communicatively couples to memory 108 and controls the operation of the monitoring device 104. The processor 106 may be 8-bit, 16-bit, 32-bit, 64-bit or of any other suitable architecture. The processor 106 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 106 may include other hardware that operates software to control and process information. The processor 106 executes software stored on memory to perform any of the functions described herein.

The processor 106 controls the operation and administration of the monitoring device 104 by processing information (e.g., information received from the devices 102 and memory 108). The processor 106 may be a programmable logic device, a microcontroller, a microprocessor, any suitable processing device, or any suitable combination of the preceding. The processor 106 is not limited to a single processing device and may encompass multiple processing devices.

The memory 108 may store, either permanently or temporarily, data, operational software, or other information for the processor 106. The memory 108 may include any one or a combination of volatile or non-volatile local or remote devices suitable for storing information. For example, the memory 108 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 108, a disk, a CD, or a flash drive. In particular embodiments, the software may include an application executable by the processor 106 to perform one or more of the functions described herein.

The monitoring device 104 receives one or more indications 110 from one or more of the power supplies of the devices 102. The indications 110 may indicate the devices 102 or the power supplies that have detected electrical power disturbances. These indications 110 may include the times that the electrical power disturbances were detected. Additionally, the indications 110 may indicate the locations of the devices 102 or the power supplies.

Based on the information in the indications, the monitoring device 104 may determine one or more events 112 that caused one or more of the detected electrical power disturbances. For example, the monitoring device 104 may generate a map based on the information in the indications 110. The map may show the locations of the devices 102 or the power supplies that detected the electrical power disturbances. The map may also indicate the times that the electrical power disturbances were detected. Based on the map, the monitoring device 104 may determine the location and the temporal spread of the electrical power disturbance. Using this information, the monitoring device 104 may determine one or more events 112 that caused the electrical power disturbance. For example, if the electrical power disturbance affected a large number of devices 102 in a region and if the electrical power disturbance appears to have spread from a main power switch or breaker, then the monitoring device 104 may determine that the event 112 is a utility event (e.g., a power failure). As another example, if the electrical power disturbances are detected in only a few devices 102 that are at different locations or in a single device 102, then the monitoring device 104 may determine that the event 112 is a hardware failure in these devices 102 or in the single device 102.

After determining the one or more events 112, the monitoring device 104 may determine one or more suitable remedies 114 for the detected electrical power disturbances. For example, if the event 112 is a utility failure, the monitoring device 104 may determine that the remedy 114 should be to contact a utility company to fix the utility failure. As another example, if the monitoring device 104 determines that the event 112 is a hardware failure in certain devices 102, then the monitoring device 104 may determine that the hardware manufacturer should be notified to repair the devices 102. In this manner, the monitoring device 104 diagnoses and remedies electrical power disturbances even if the electrical power disturbances are intermittent or difficult to reproduce, in particular embodiments. For example, the monitoring device 104 may have information pertaining to the electrical power disturbances from the indications 110 so that the utility company and the hardware manufacturer do not need to reproduce the electrical power disturbance to understand how to remedy the event(s) 112 that caused the electrical power disturbance. Additional details for the monitoring device 104 are provided with respect to FIGS. 3 and 5.

Figure 2:
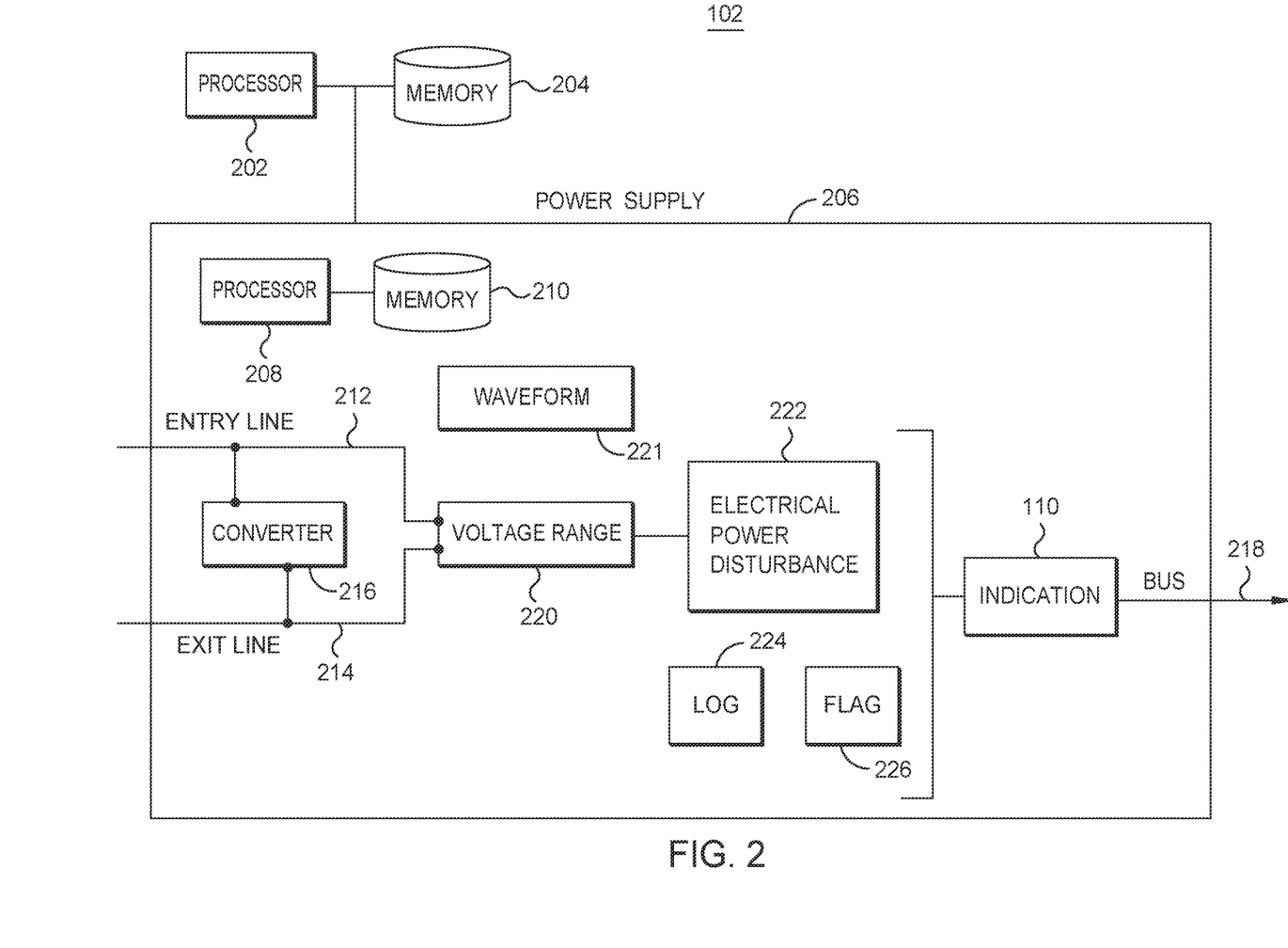
FIG. 2 illustrates an example device in the system of FIG. 1.

FIG. 2 illustrates an example device 102 in the system 100 of FIG. 1. As seen in FIG. 2, the device 102 includes a processor 202, a memory 204, and a power supply 206. Generally, the processor 202 and the memory 204 are configured to perform any of the functions and actions of the device 102 described herein. Additionally, the power supply 206 is configured to supply electrical power to other components of the device 102. The power supply 206 is also configured to detect electrical power disturbances in the device 102. In particular embodiments, the power supply 206 can detect electrical power disturbances that are intermittent or difficult to reproduce.

The processor 202 is any electronic circuitry, including, but not limited to microprocessors, application specific integrated circuits (ASIC), application specific instruction set processor (ASIP), and/or state machines, that communicatively couples to memory 204 and controls the operation of the device 102. The processor 202 may be 8-bit, 16-bit, 32-bit, 64-bit or of any other suitable architecture. The processor 202 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 202 may include other hardware that operates software to control and process information. The processor 202 executes software stored on memory to perform any of the functions described herein. The processor 202 controls the operation and administration of the device 102 by processing information (e.g., information received from the power supply 206 and memory 204). The processor 202 may be a programmable logic device, a microcontroller, a microprocessor, any suitable processing device, or any suitable combination of the preceding. The processor 202 is not limited to a single processing device and may encompass multiple processing devices.

The memory 204 may store, either permanently or temporarily, data, operational software, or other information for the processor 202. The memory 204 may include any one or a combination of volatile or non-volatile local or remote devices suitable for storing information. For example, the memory 204 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 204, a disk, a CD, or a flash drive. In particular embodiments, the software may include an application executable by the processor 202 to perform one or more of the functions described herein.

As seen in FIG. 2, the power supply 206 includes a processor 208 and memory 210, which are configured to perform any of the functions or actions of the power supply 206 described herein. Additionally, the power supply 206 includes a converter 216 and a bus 218.

The processor 208 is any electronic circuitry, including, but not limited to microprocessors, application specific integrated circuits (ASIC), application specific instruction set processor (ASIP), and/or state machines, that communicatively couples to memory 210 and controls the operation of the power supply 206. The processor 208 may be 8-bit, 16-bit, 32-bit, 64-bit or of any other suitable architecture. The processor 208 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 208 may include other hardware that operates software to control and process information. The processor 208 executes software stored on memory to perform any of the functions described herein. The processor 208 controls the operation and administration of the power supply 206 by processing information (e.g., information received from the devices 102 and memory 210). The processor 208 may be a programmable logic device, a microcontroller, a microprocessor, any suitable processing device, or any suitable combination of the preceding. The processor 208 is not limited to a single processing device and may encompass multiple processing devices.

The memory 210 may store, either permanently or temporarily, data, operational software, or other information for the processor 208. The memory 210 may include any one or a combination of volatile or non-volatile local or remote devices suitable for storing information. For example, the memory 210 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 210, a disk, a CD, or a flash drive. In particular embodiments, the software may include an application executable by the processor 208 to perform one or more of the functions described herein.

The converter 216 converts electrical power received over an entry line 212 of the power supply 206 and directs the converted electrical power to an exit line 214 of the power supply 206. For example, the converter 216 may convert alternating current (AC) electrical power received over the entry line 212 into direct current (DC) electrical power. The converter 216 may then direct the DC electrical power to the exit line 214. The entry line 212 may receive the AC electrical power through a plug outlet. The exit line 214 may supply the DC electrical power to other components of the device 102, such as the processor 202 and the memory 204. In this manner, the power supply 206 supplies electrical power to the device 102.

The power supply 102 also monitors the electrical power over the entry line 212 and the exit line 214 to determine whether an electrical power disturbance is occurring. For example, the power supply 206 may sample the electrical power over the entry line 212 and the exit line 214 at a particular data rate (e.g., 0.05 milliseconds) to produce one or more waveforms 221. The waveform 221 may show the temporal progression of the electrical signals over the entry line 212 or the exit line 214. An electrical power disturbance may cause the waveform 221 to deviate from a steady state waveform.

The power supply 206 compares the waveform 221 to one or more voltage ranges 220. The voltage ranges 220 may set upper and lower bounds on the voltage signals over the entry line 212 or the exit line 214. When the waveform 221 exceeds the upper bound or falls below the lower bound in the voltage range 220, the power supply 206 may determine that an electrical power disturbance 222 has occurred. For example, if a portion of the waveform 221 exceeds the upper bound of the voltage range 220, the power supply 206 may determine that an electrical power disturbance 222 has occurred. As another example, if a portion of the waveform 221 falls below the lower bound of the voltage range 220, the power supply 206 may determine that an electrical power disturbance 222 has occurred.

In particular embodiments, the power supply 206 determines that an electrical power disturbance 222 occurred when the voltage in the waveform 221 falls outside the voltage range 220 for a preset period of time. In this manner, brief deviations from the voltage range 220 are ignored. The preset duration of time may be adjusted based on how much the voltage in the waveform 221 falls outside the voltage range 220. For example, the more the voltage in the waveform 221 falls outside the voltage range 220, the shorter the duration of time is. In this manner, larger deviations need only occur for a shorter period of time before the power supply 206 determines that an electrical power disturbance 222 has occurred.

In certain embodiments, the power supply 206 may determine from the waveform 221 whether the power supply 206 has crashed. For example, the power supply 206 may notice that the voltage signal in the waveform 221 has dropped significantly for a long period of time. As another example, the power supply 206 may detect that the voltage signal in the waveform 221 has become erratic for a long period of time. In response, the power supply 206 may determine that the power supply 206 has crashed. The power supply 206 may reboot itself in response to the determination that the power supply 206 has crashed. For example, the power supply 206 may stop electrical power to the processor 208 for a period of time and then resupply electrical power to the processor 208 to reboot the processor 208.

When the power supply 206 detects an electrical power disturbance 222, the power supply 206 may log certain details about the electrical power disturbance 222 in a log 224. For example, the power supply 206 may log the time of the detected electrical power disturbance 222. Additionally, the power supply 206 may log the voltage in the waveform 221 that fell outside the voltage range 220. The power supply 206 may also set a flag 226 that indicates an electrical power disturbance 222 was detected by the power supply 206. This information may later be used by the monitoring device 104 to diagnose the electrical power disturbance 222.

The power supply 206 generates an indication 110 of the electrical power disturbance 222. The indication 110 may include the information in the log 224 or the flag 226. The power supply 206 may communicate the indication 110 to the monitoring device 104 to alert the monitoring device 104 of the electrical power disturbance 222. In certain embodiments, the power supply 206 may communicate the indication 110 to a database that is monitored by the monitoring device 104. By communicating the indication 110 to the database rather than the monitoring device 104, the power supply 206 provides for asynchronous handling of the indication 110.

The power supply 206 may communicate the indication 110 over a bus 218. The bus 218 may be any suitable communication medium. For example, the bus 218 may be an inter-integrated circuit (I2C) bus. As another example, the bus 218 may be a standard commands for programmable instruments (SCPI) bus. As yet another example, the bus 218 may be an Ethernet bus. The power supply 206 may communicate the indications 110 over the bus 218 to the monitoring device 104 or to a database.

Figure 3:
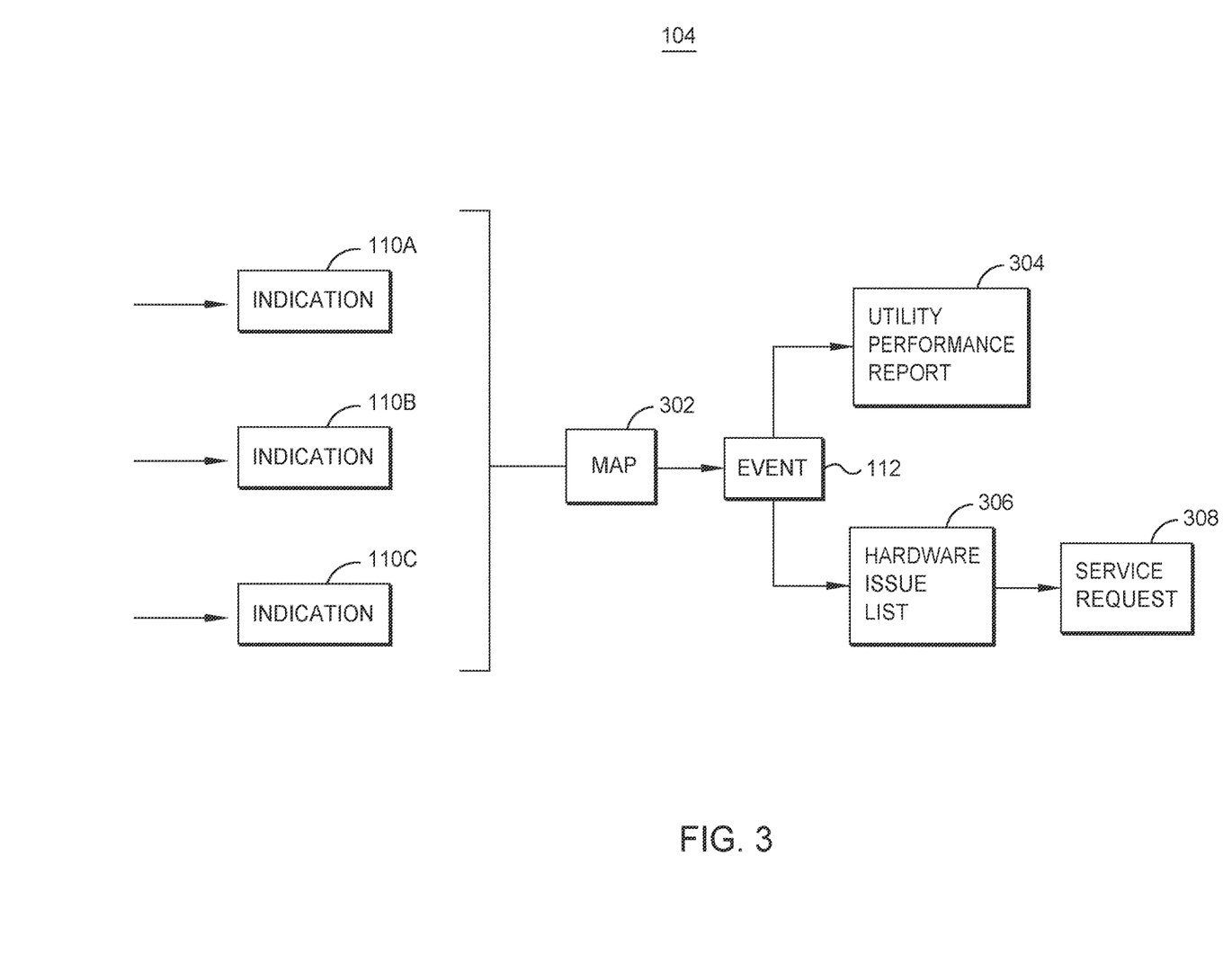
FIG. 3 illustrates an example monitoring device in the system of FIG. 1.

FIG. 3 illustrates an example monitoring device 104 in the system 100 of FIG. 1. Generally, the monitoring device 104 diagnoses the cause of detected electrical power disturbances and determines suitable remedies for the electrical power disturbances. In particular embodiments, the monitoring device 104 diagnoses electrical power disturbances even though the electrical power disturbances are intermittent or difficult to reproduce.

The monitoring device 104 receives one or more indications 110 from one or more power supplies 206. The indications 110 may include information about detected electrical power disturbances. In certain embodiments, the monitoring device 104 may receive the indications 110 from a database rather than directly from the power supplies 206. In the example of FIG. 3, the monitoring device 104 receives indications 110A, 110B, and 110C. The monitoring device 104 may receive these indications 110A, 110B, and 110C from different power supplies 206 in the system 100. The indications 110 may include information about detected electrical power disturbances. For example, the indications 110 may include the times at which the electrical power disturbances were detected. Additionally, the indications 110 may include the locations of the power supplies 206 that detected the electrical power disturbances. The indications 110 may also include the voltages that triggered the detected electrical power disturbances.

Based on the information in the indications 110, the monitoring device 104 generates a map 302 that shows the locations and spread of the detected electrical power disturbances. For example, the map 302 may show the physical locations of the electrical power disturbances. Additionally, the map 302 may show the temporal order in which the electrical power disturbances were detected. The map 302 may have a time progression that shows the development and spread of electrical power disturbances. Based on the map 302, the monitoring device 104 may determine an event 112 that caused the electrical power disturbances. For example, if the electrical power disturbances affected many devices 102 in a region, then the monitoring device 104 may determine that the event 112 is a utility event such as a power failure. As another example, if the map 302 shows that the electrical power disturbances were localized to individual devices 102 that were located far away from each other, then the monitoring device 104 may determine that the event 112 is a hardware failure in these devices 102. For example, a component of the power supply 206 in these devices may have degraded and should be replaced. The temporal spread of the electrical power disturbances may also indicate the type of event 112. For example, if multiple electrical power disturbances were detected at vastly different times, then the monitoring device 104 may determine that different events 112 caused these electrical power disturbances.

Based on the determined event 112, the monitoring device 104 may take suitable remedial action. For example, if the event 112 is a utility event, the monitoring device 104 may update a utility performance report 304. The utility performance report 304 may indicate the utility failure and the time of the utility failure. The utility performance report 304 may be provided to a utility company so that the utility company can repair the utility failure. As another example, if the event 112 is a hardware event, then the monitoring device 104 may update a hardware issue list 306 that indicates the hardware that has failed. For example, the hardware issue list 306 may indicate the power supplies 206 that detected the power failure. Additionally, the hardware issue list 306 may indicate the devices 102 that may have degraded hardware. The monitoring device 104 then generates a service request 308 that identifies the power supplies 206 or devices 102 that are experiencing hardware issues. The service request 308 may be communicated to a hardware vendor or manufacturer to alert them of the hardware failure. The manufacturer or vendor may then repair or replace the faulty hardware.

In particular embodiments, the monitoring device 104 may examine one or more flags 226 to determine whether an electrical power disturbance was detected. The flags 226 may be set in the power supplies 206 or stored in a database. In some embodiments, the flags 226 may be communicated with the indications 110. Using these flags 226, the monitoring device 104 may be alerted to the detected electrical power disturbance and in response, retrieve the appropriate indications 110 to diagnose the electrical power disturbance.

Figure 4:
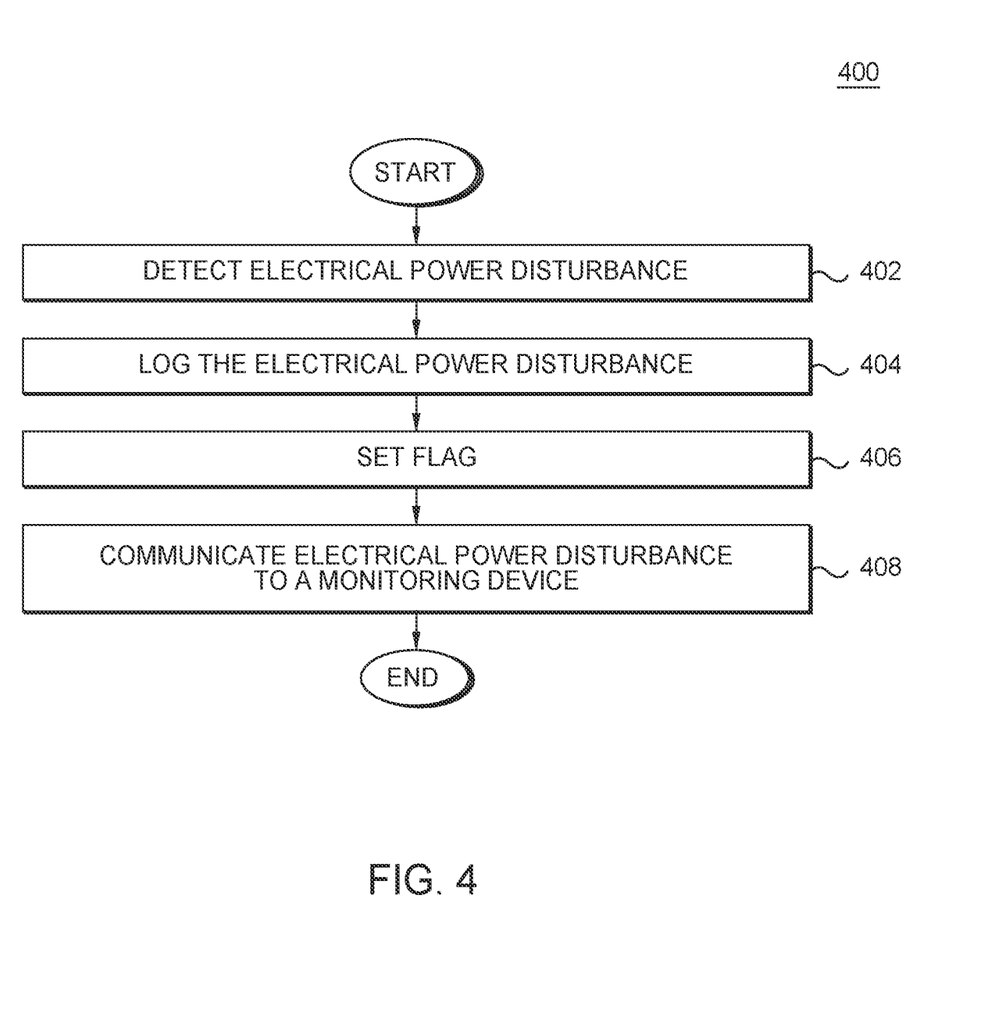
FIG. 4 is a flowchart of an example method in the system of FIG. 1.

FIG. 4 is a flow chart of an example method 400 in the system 100 in FIG. 1. Generally, a power supply 206 performs the method 400. In particular embodiments, by performing the method 400, the power supply 206 can detect an electrical power disturbance even if the electrical power disturbance is intermittent or difficult to reproduce.

In step 402, the power supply 206 detects an electrical power disturbance. For example, the power supply 206 may monitor the voltages on an entry line 212 and an exit line 214 of the power supply 206. When these voltage signals fall outside a preset voltage range 220, the power supply 206 may determine that an electrical power disturbance has occurred.

In step 404, the power supply 206 logs the electrical power disturbance. For example, the power supply 206 may log the time of the electrical power disturbance in a log 224. Additionally, the power supply 206 may include the location of the power supply 206 and the voltage over the entry line 212 or the exit line 214 that triggered the detection of the electrical power disturbance.

In step 406, the power supply 206 sets a flag 226 that indicates the electrical power disturbance was detected. The flag 226 may be set and stored in a database to alert a monitoring device that an electrical power disturbance was detected. In step 408, the power supply 206 communicates an indication 110 of the electrical power disturbance to a monitoring device 104. The indication 110 may include information about the power supply 206 or the electrical power disturbance. For example, the indication 110 may include the location of the power supply 206 and the time of the detected electrical power disturbance. Additionally, the indication 110 may include the flag 226 and the voltage over the entry line 212 or the exit line 214 that triggered the detection of the electrical power disturbance. The monitoring device 104 may use the information in the indication 110 to diagnose the electrical power disturbance.

Figure 5:
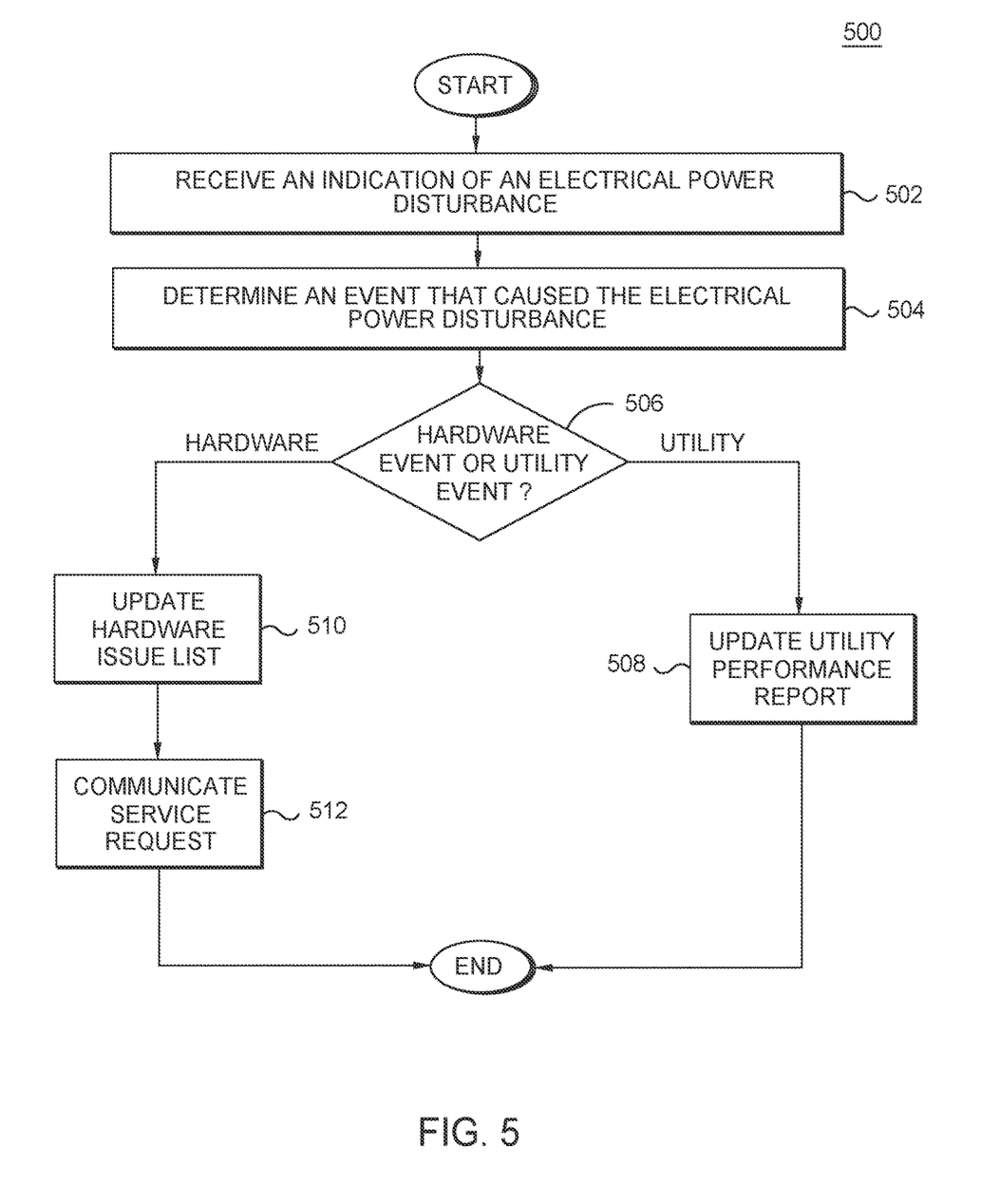
FIG. 5 is a flowchart of an example method in the system of FIG. 1.

FIG. 5 is a flow chart of an example method 500 in the system 100 of FIG. 1. Generally, the monitoring device 104 performs the steps of the method 500. In particular embodiments, by performing the method 500, the monitoring device 104 diagnoses electrical power disturbances even if the electrical power disturbances are intermittent or difficult to reproduce.

In step 502, the monitoring device 104 receives an indication 110 of an electrical power disturbance. The monitoring device 104 may receive the indication 110 from a power supply 206 of a device 102. In some embodiments, the monitoring device 104 may receive the indication 110 from a database rather than directly from the power supply 206. The indication 110 may include information about the power supply 206 and the electrical power disturbance. For example, the indication 110 may include a location of the power supply 206 that detected the electrical power disturbance. As another example, the indication 110 may include a time at which the electrical power disturbance was detected. The indication 110 may also include a voltage in the power supply 206 that triggered the detection of the electrical power disturbance. The indication 110 may further include a flag 226 that indicates or alerts the monitoring device 104 of an electrical power disturbance. In some embodiments, the flag 226 may be stored in the database separate from the indication 110. In other embodiments, the flag 226 may be set in the power supply 206 and the monitoring device 104 may detect the flag 226 when the flag 226 is set.

In step 504, the monitoring device 104 determines an event 112 that caused the electrical power disturbance. The monitoring device 104 may determine the event based on the information within the indication 110. In some embodiments, the monitoring device 104 may generate a map 302 based on the information in the indication 110. For example, the map 302 may show the locations of the power supplies 206 that detected electrical power disturbances and the temporal spread of the electrical power disturbances. The monitoring device 104 may then determine the event 112 based on the map 302.

In step 506, the monitoring device 104 determines whether the event 112 is a hardware event or a utility event. The monitoring device 104 may make this determination using the information within the map 302. For example, if the map 302 shows that an electrical power disturbance is widespread and affected several power supplies 206 and devices 102, then the monitoring device 104 may determine that the event 112 is a utility event. As another example, if the map 302 shows that the electrical power disturbance is localized to a few devices 102 that are physically or geographically distanced from each other, then the monitoring device 104 may determine that the event 112 is a hardware event.

If the monitoring device 104 determines that the event 112 is a utility event, then the monitoring device 104 updates a utility performance report 304 in step 508. The utility performance report 304 may be provided to the utility company so that the utility company can repair the fault that caused the utility event. If the monitoring device 104 determines that the event 112 is a hardware event, then the monitoring device 104 may update a hardware issue list 306 in step 510. The hardware issue list 306 may indicate the power supplies 206 or devices 102 that have degraded components. Additionally, the hardware issue list 306 may identify the particular components within the devices 102 with the power supplies 206 that need replacing. In step 512, the monitoring device 104 communicates a service request 308 using the information in the hardware issue list 306. The service request 308 may be communicated to a hardware manufacturer or vendor so that the manufacturer or vendor repairs or replaces the faulty hardware indicated in the hardware issue list 510.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. An apparatus comprising:
a memory; and
a hardware processor communicatively coupled to the memory, the hardware processor configured to:
receive, from a plurality of power supplies, a plurality of indications of a first electrical power disturbance and a second electrical power disturbance detected by the plurality of power supplies;
determine locations of the plurality of power supplies based on the plurality of indications;
determine times when the first electrical power disturbance and the second electrical power disturbance were detected by the plurality of power supplies based on the plurality of indications;
determine, based on the determined locations and the determines times, that the first electrical power disturbance affected a first number of devices and spread from a power switch or breaker;
in response to determining that the first electrical power disturbance affected the first number of devices and spread from the power switch or breaker, determine that the first electrical power disturbance was caused by a utility event;
determine a first remedy for the first electrical power disturbance based on the first electrical power disturbance being caused by the utility event;
determine, based on the determined locations and the determines times, that the second electrical power disturbance affected a second number of devices less than the first number;

in response to determining that the second electrical power disturbance affected the second number of devices, determine that the second electrical power disturbance was caused by a hardware failure; and determine a second remedy different from the first remedy for the second electrical power disturbance based on the second electrical power disturbance being caused by the hardware failure.

2. The apparatus of claim 1, wherein the hardware processor is further configured to generate a map showing the locations of the plurality of power supplies.

3. The apparatus of claim 2, wherein the hardware processor is further configured to determine whether the utility event or the hardware failure caused the second electrical power disturbance based on the map.

4. The apparatus of claim 3, wherein the hardware processor is further configured to communicate, in response to determining that the hardware failure caused the second electrical power disturbance, a request for servicing of a plurality of devices corresponding to plurality of power supplies.

5. The apparatus of claim 1, wherein the plurality of indications comprises the times when the first electrical power disturbance and the second electrical power disturbance were detected by the plurality of power supplies.

6. The apparatus of claim 1, wherein the hardware processor is further configured to examine a flag to determine whether the first electrical power disturbance occurred.

* * * * *